United States Patent [19]
Chan

[11] Patent Number: 5,372,959
[45] Date of Patent: Dec. 13, 1994

[54] THIN FILM TRANSISTOR HAVING A MULTI-LAYER STACKED CHANNEL AND ITS MANUFACTURING METHOD

[75] Inventor: Ha H. Chan, Kyoungki-do, Rep. of Korea

[73] Assignee: Hyundai Electronics Industries Co., Ltd., Rep. of Korea

[21] Appl. No.: 85,399

[22] Filed: Jun. 30, 1993

[30] Foreign Application Priority Data

Jul. 1, 1992 [KR] Rep. of Korea ............... 92-11680

[51] Int. Cl.$^5$ .................................. H01L 21/265
[52] U.S. Cl. .................................. 437/41; 437/915; 437/101; 437/909; 148/DIG. 164
[58] Field of Search .............. 437/40, 41, 101, 909, 437/915; 148/DIG. 164

[56] References Cited

U.S. PATENT DOCUMENTS 5,221,849  6/1993  Goronkin et al. ............... 257/20

Primary Examiner—George Fourson
Assistant Examiner—Richard A. Booth
Attorney, Agent, or Firm—Fish & Richardson

[57] ABSTRACT

Disclosed is a thin film transistor used to manufacture a highly integrated SRAM or LCD and its manufacturing method, and more particularly, to a thin film transistor having a multi-layer stacked channel in order to increase the current flow during the thin film transistor's ON state by securing a enough channel width despite of the limited area. A thin film transistor on which a channel had been deposited in accordance with the present invention can be manufactured in a small area; accordingly, a highly integrated SRAM can be manufactured by decreasing the area of the unit cell of SRAM. Also, the resolution can be enhanced by decreasing the area occupied by the thin film transistor in the panel during the manufacturing process of the LCD.

4 Claims, 2 Drawing Sheets

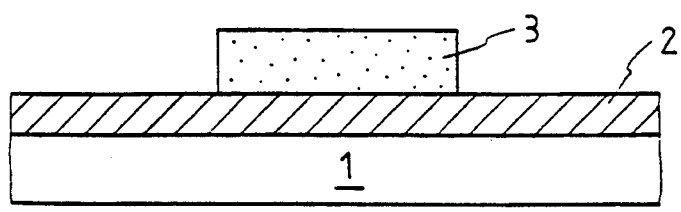 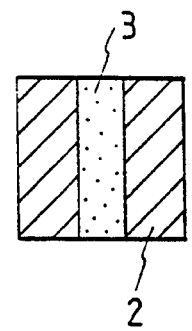
FIG. 1a      FIG. 1b
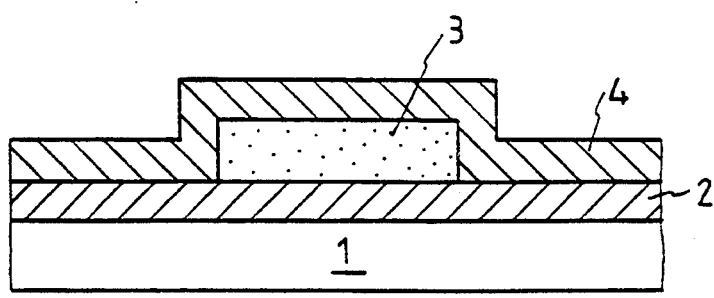 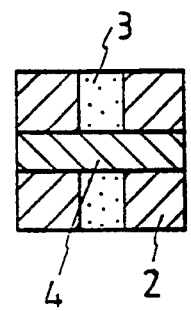
FIG. 2a      FIG. 2b
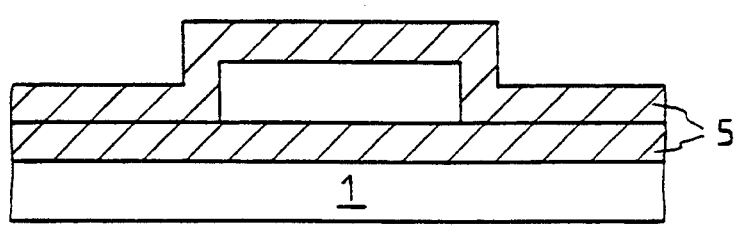 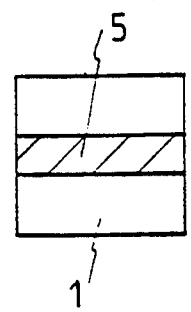
FIG. 3a      FIG. 3b

THIN FILM TRANSISTOR HAVING A MULTI-LAYER STACKED CHANNEL AND ITS MANUFACTURING METHOD

FIELD OF THE INVENTION

This invention relates to a thin film transistor used in a highly integrated Static Random Access Memory (SRAM) or Liquid Crystal Display (LCD) and its manufacturing method and more particularly, to a thin film transistor having a multi-layer stacked channel in order to increase the current flow during the transistor's ON state by securing a enough channel width despite of the limited space available.

BACKGROUND OF THE INVENTION

Generally, conventional manufacturing methods of the thin film transistor are performed as following first, a semiconductor thin film for channels is formed flatly; second, a thin film transistor gate insulating layer and thin film transistor gate are formed over it; and lastly, a source/drain is formed by implanting impurities onto a portion of the semiconductor thin film.

However, when applying the above mentioned thin film transistor manufacturing technique to the manufacture of a next generation highly integrated SRAM or LCD, the unit cell area increases greatly and, as a result, the device size increases. That is why the above mentioned technique is not suited for manufacturing the highly integrated SRAM. Also, during the manufacturing process of an LCD requiring a high resolution, the unit area occupied by the thin film transistor must be minimized in order to upgrade the resolution. However, this objective can not be achieved by applying the conventional manufacturing technique of the thin film transistors.

SUMMARY OF THE INVENTION

In order to overcome these problems, the present invention provides a thin film transistor having a multi-layer stacked channel that is capable of increasing the current flow during the transistor's ON state. Therefore, the inventive thin film transistor provides a large enough channel width although it occupies minimized area.

BRIEF DESCRIPTION OF THE DRAWINGS

FIG. 1 through FIG. 4 are diagrams illustrating the steps of manufacturing a stacked thin film transistor of the present invention.

FIGS. 1(a) and 1(b) are a cross sectional view and a top view illustrating the forming of a second insulating layer pattern after depositing a first polysilicon layer on top of a first insulating layer.

FIGS. 2(a) and 2(b) are a cross sectional view and a top view illustrating the forming of the second polysilicon layer pattern.

FIGS. 3(a) and 3(b) are a cross sectional view and a top view illustrating the forming of a thin film transistor gate after removing the second insulating layer pattern.

DETAILED DESCRIPTION OF THE INVENTION

Figure 4A:
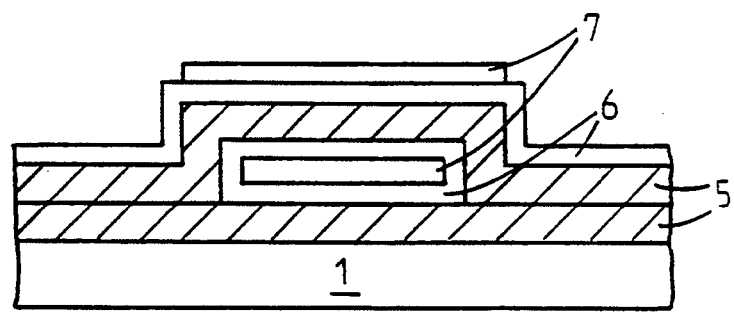
FIGS. 4(a), 4(b), and 4(c) are cross sectional views and a top view illustrating the forming of a gate insulating layer, a channel, source and drain of the thin film transistor.

Now, the embodiments of the present invention will be explained in detail by referring to the accompanying drawings.

As shown in FIGS. 1(a) and 1(b), a first polysilicon layer 2 is deposited over a first insulating layer 1 and over it, a second insulating layer 3, for example silicon oxide layer, is deposited. And then, the second insulating layer 3 is patterned via pattern processing or a lithographic technique. FIG. 1(b) which is a top view of FIG. 1(a) shows that the second insulating layer pattern 3 elongates lengthwise. Upon the completion of the processes illustrated in FIG. 1, a second polysilicon layer 4 is deposited and patterned using a lithographic technique as shown in FIGS. 2(a). In FIG. 2(b), the second polysilicon layer pattern 4 is elongated horizontally.

Next, the second insulating layer 3 is removed via a wet etching process and a tunnel between the first polysilicon layer 2 and the second polysilicon layer 4 is formed. And then, portions of the first polysilicon layer 2 that are not overlapped by the second. polysilicon layer pattern 4 are etched out as shown in FIGS. 3(a) and 3(b). The remaining first and second polysilicon layer pattern numbered as 5 in the figures serves as a gate of the thin film transistor.

Figure 4B:
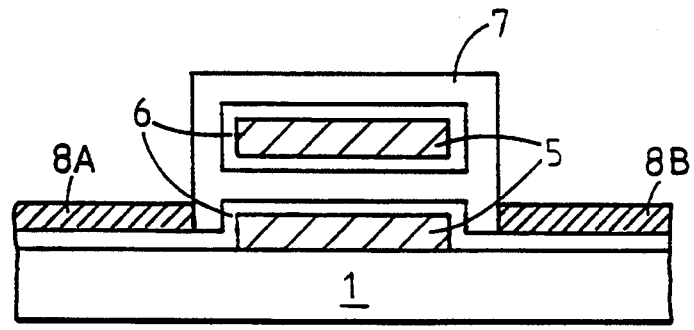

After the processes illustrated in FIG. 3, a gate insulating layer 6 is deposited on the tunnel surface and over the thin film transistor gate 5 and then, a third polysilicon layer 7 is deposited on the surface of the gate insulating layer 6 located on the upper part of the structure and in the tunnel. The third polysilicon layer is patterned via a pattern processing of the lithographic technique to form a thin film transistor channel 7 and then, an impurity that is different type from that of the impurity implanted into the channel area of the third polysilicon layer pattern is implanted into the part other than predetermined channel area to form a source 8A and drain 8B of the thin film transistor. FIGS. 4(a) and 4(b) illustrate the stacking of the double-layered channel 7 of the thin film transistor.

Figure 4C:
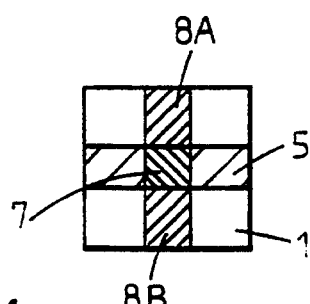

FIG. 4(c) is a top view of the device shown in FIGS. 4(a) and 4(b). FIGS. 4(a) and 4(b) which are cross sectional view can be obtained by taking along the horizontal center line (not illustrated) and the lengthwise center line (not illustrated) respectively, in FIG. 4(c).

It is understood that various other modifications will be apparent to and can be readily made by those skilled in the art without departing from the scope and spirit of the invention. For example, a solid source can be used, instead of an ion-injection process, to form the source and drain of the thin film transistor. Also, the channel of thin film transistor can use, instead of a polysilicon layer, an amorphous silicon layer. Furthermore, the channel of thin film transistor can be formed on the lower part of the gate of thin film transistor instead of forming it on the upper part of the gate of thin film transistor.

As described so far, by manufacturing a thin film transistor having a multi-layer stacked channel, enough channel width can be secured despite the limitation imposed by the small size and accordingly, the current flow during the thin film transistor's ON state can be increased. By doing so, the unit cell area of the highly integrated SRAM can be decreased for higher integrity. Also, since the area occupied by the thin film transistor can be reduced during the manufacturing of LCD requiring a high resolution, a resolution higher than that of the conventional LCD can be obtained.

What is claimed is:

1. A method of manufacturing a thin film transistor comprising the steps of:

depositing a first silicon layer on a first insulating layer;

forming a second insulating layer pattern on a part of the first silicon layer;

depositing a second silicon layer on the first silicon layer and the second insulating layer pattern and forming therefrom an elongated second silicon layer pattern crossing over the second insulating layer pattern;

wet etching said second insulating layer pattern completely to form a tunnel between the first silicon layer and the second silicon layer;

using a lithographic technique to form a first silicon layer pattern that has the same pattern as the second silicon layer pattern and to thereby form a thin film transistor gate having at two ends thereof the first silicon layer pattern connected to the second silicon layer pattern;

forming a gate oxide layer on the tunnel surface of the thin film transistor gate and on top of the gate;

depositing a third silicon layer on the surface of the gate oxide layer and forming a third silicon layer pattern via a lithographic technique to form a double-layered thin film transistor channel in the tunnel of the gate and on top of the gate; and forming a source and drain by implanting impurities into a part of the third silicon layer pattern that does not belong to the channel area.

2. The method according to claim 1, wherein
said first silicon layer, second silicon layer, and third silicon layer are made of a polysilicon layer or amorphous silicon layer.

3. The method according to claim 1, wherein
said source and drain are formed on the part of the third silicon layer that does not overlap with the thin film transistor gate.

4. The method according to claim 1, wherein
said first and second silicon layer patterns are crossed with the third silicon layer pattern.

* * * * *